United States Patent [19]

Conley

[11] 3,786,172

[45] Jan. 15, 1974

[54] PRINTED CIRCUIT BOARD METHOD AND APPARATUS

[75] Inventor: Larry R. Conley, Fountain Valley, Calif.

[73] Assignee: Accra-Point Arrays Corporation, Santa Ana, Calif.

[22] Filed: Dec. 7, 1972

[21] Appl. No.: 311,738

[52] U.S. Cl. ........... 174/68.5, 29/626, 317/101 CC, 339/17 C

[51] Int. Cl. ............................................ H05b 1/18

[58] Field of Search ................ 174/68.5; 317/101 B, 317/101 C, 101 CC, 101 CM; 29/626, 625; 339/17 C; 338/307, 308, 309

[56] References Cited

UNITED STATES PATENTS

| | | | |
|---|---|---|---|
| 3,621,567 | 11/1971 | Hasengawa et al. | 338/308 X |
| 3,256,586 | 6/1966 | Douglas et al. | 174/68.5 X |
| 3,514,538 | 5/1970 | Chadwick et al. | 174/68.5 |
| 3,566,005 | 2/1971 | Shaheen | 174/68.5 |
| 3,643,133 | 2/1972 | Towell | 174/68.5 X |

*Primary Examiner*—Darrell L. Clay
*Attorney*—Samuel Lindenberg et al.

[57] ABSTRACT

A method for the low cost production of printed circuits with both soldered-in component leads and welded wire connections, which includes applying a sheet of highly weldable material such as stainless steel to an insulative board, plating a layer of highly solderable material such as copper over the stainless steel, applying a first resist pattern and then a first etchant such as ferric chloride that etches both copper and stainless steel to form a predetermined printed circuit pattern, and then applying a second resist pattern and a second etchant such as chromic acid which etches only the copper to leave exposed regions of the stainless steel. Components can be wave soldered in place, and the solder will not adhere to the stainless steel so that wires can later be welded to the exposed stainless steel weld regions. More uniform welding can be obtained by applying an underlayer of copper to the insulative substrate under the stainless steel layer, so that there is a low resistance path to all weld regions.

4 Claims, 11 Drawing Figures

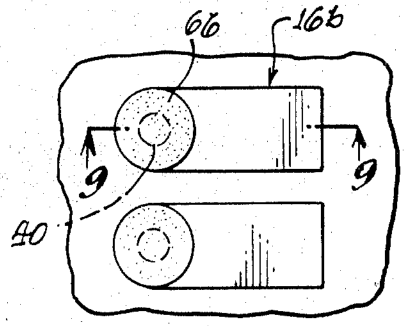
FIG. 8.
FIG. 9.
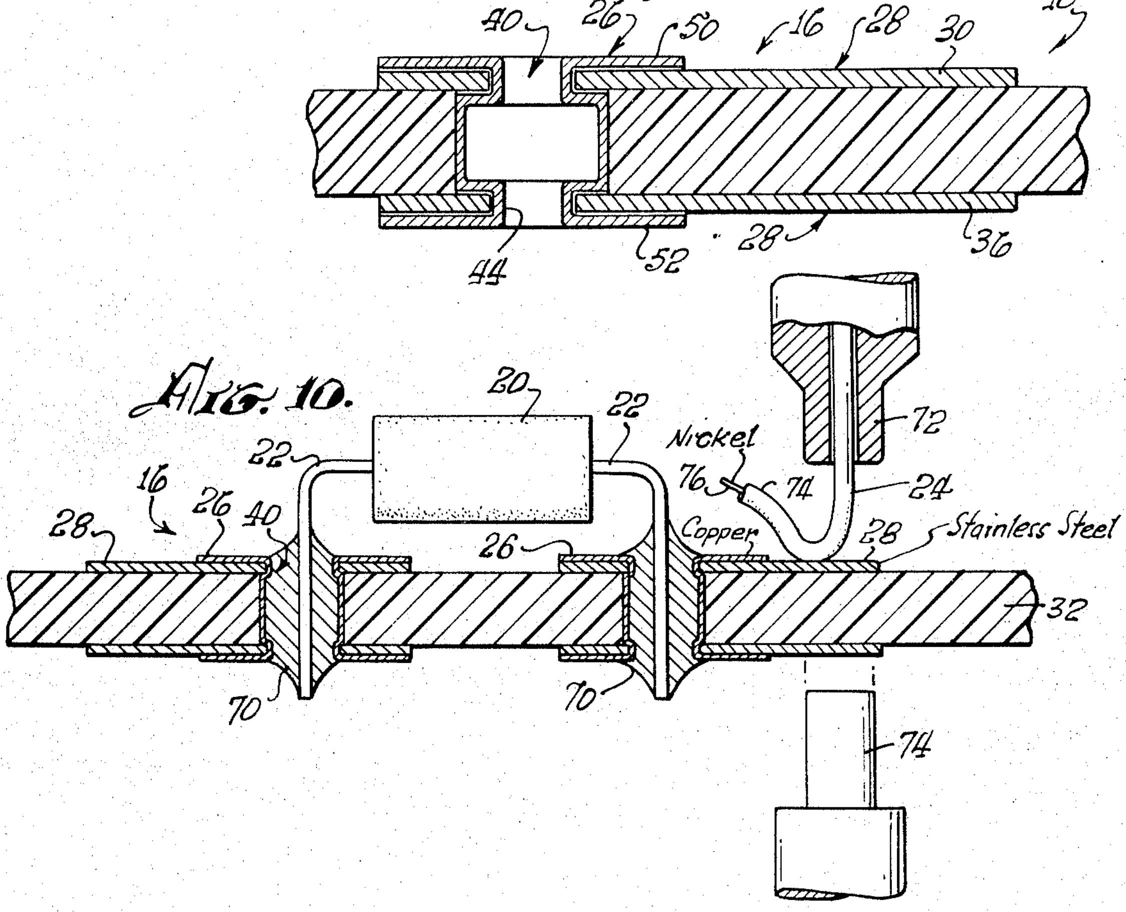
FIG. 9, FIG. 10.
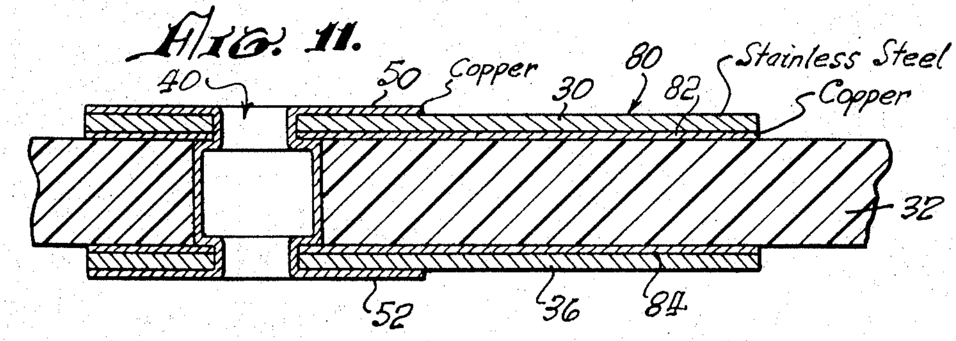
FIG. 11.

PRINTED CIRCUIT BOARD METHOD AND APPARATUS

BACKGROUND OF THE INVENTION

This invention relates to printed circuit boards and the like.

The most common type of printed circuit board includes a plate of insulative material and a layer of copper thereon which has been etched in a predetermined circuit pattern. In one type of board, holes are drilled through the board and the copper is plated through the holes and in regions immediately surrounding the holes. The leads of circuit modules or other components are then inserted into the holes from the top of the board. The entire bottom surface of the board is then wave soldered to fill the holes with solder that holds the leads in place. In many applications, it is necessary to thereafter connect wires to portions of the printed circuit, particularly to the regions around the holes that contain component leads. While wires can be soldered to the copper terminal areas, such connections are often unreliable and cannot be readily performed by automatic welding machines. It is generally more desirable to make welded wire connections by resistance welding, but copper is not a "weldable" material; that is, present technology generally does not permit reliable resistance welding to copper at moderate cost. This is because copper has such a low resistivity that a region to which welds are to be made cannot be readily heated by passing electric currents therethrough.

Welded wire connections are commonly made to printed circuit by utilizing separate pins of weldable material that extend through the board and are soldered in place. Wires of a nickel alloy having a resistivity several times greater than copper then may be resistance welded to the pins. The use of separate inserted pins results in increased cost and somewhat less reliability. If a printed circuit with both highly solderable and highly weldable regions could be constructed on a mass production basis, without the need for separately inserting pins or the like at various locations, then low cost and highly reliable circuits would be available.

SUMMARY OF THE INVENTION

In accordance with one embodiment of the present invention, a printed circuit (pc) board is provided which can be produced entirely by mass production techniques and which permits attachments by both soldering and welding. The apparatus includes a board of insulative material and layers of conductive materials thereon forming small connector regions. Each connector region includes a lower layer of weldable material such as stainless steel and an upper layer of solderable material such as copper. However, the copper covers only a portion of the stainless steel, so that regions of the stainless steel are left uncovered to permit direct welding thereto.

A printed circuit board is constructed by applying sheets of weldable material such as stainless steel to both faces of a board of insulative material such as an epoxy glass laminate, and drilling holes through the assembly. A layer of copper is then plated over both sheets of stainless steel and on the walls of the holes. A first resist is applied in a predetermined pattern on the copper. The assembly is then sprayed with a first etchant such as ferric chloride that is effective against both the stainless steel and copper. This leaves dual-layer connector regions around the holes. A second resist is applied to the assembly over the holes and over small areas thereabout, so that only some portions of each connector region are covered. The assembly is then subjected to a second etchant such as chromic acid which is effective against copper but not against stainless steel. This leaves weld pads, where the stainless steel is exposed, which are integral with the copper-covered regions of stainless steel that extend up to the holes. The leads of components can be inserted into the holes from the top thereof, and the entire bottom surface of the assembly can then be wave soldered to fill the holes with solder that holds the leads in place. The solder will not stick to the stainless steel. Wires of material such as nickel can be attached to the circuit board by welding them to the stainless steel weld pads.

In another printed circuit board, a copper underlayer is applied to the insulative plate under the stainless steel layer, so that in the finished board all weld pad regions include a layer of copper under the exposed stainless steel. The copper underlayer assures a low resistance path to any point of the weld pads, since current entering the stainless steel can flow along the copper underlayer to the hole region. This provides a more uniform resistance in the resistance welding of wires to the weld paths, regardless of the particular point at which the weld is made.

The novel features of the invention are set forth with particularity in the appended claims. The invention will best be understood from the following description when read in conjunction with the accompanying drawings.

BRIEF DESCRIPTION OF THE DRAWINGS

FIG. 8 is a plan view of the assembly of FIG. 7, but showing it after a resist has been applied in a second pattern thereon;

FIG. 9 is a sectional view taken on the line 9—9 of FIG. 8, showing the assembly thereof after it has been etched with a second etchant that attacks the copper layer and the nickel strike, but not the stainless steel layer;

FIG. 10 is a sectional view of the assembly of FIG. 9, after a component has been soldered in, and during the welding of a connecting wire thereto; and FIG. 11 is a partially sectional view of a printed circuit board constructed in accordance with a second embodiment of the invention.

DESCRIPTION OF THE PREFERRED EMBODIMENTS

Figure 1:
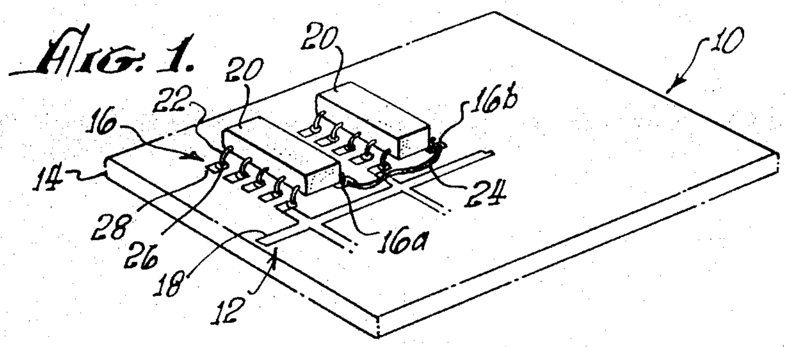
FIG. 1 is a partial perspective view of a circuit assembly constructed in accordance with the present invention.

FIG. 1 illustrates a circuit assembly 10 constructed in accordance with the invention, which includes a printed circuit 12 containing an insulative base 14 and conductive regions formed in layers thereon. The conductive regions include those of connector pads 16, most of which are separated from one another, and elongated connector strips 18 that connect some of the connector pads together. Integrated circuit components 20 have leads 22 that are attached to the printed circuit by solder connections. Each lead 22 extends through a hole in the printed circuit and is soldered in place therein. In addition, some of the connector pad regions, such as **16*a* and 16*b* are connected together by wires 24 that are welded thereto. Both solder and weld connections are made possible by constructing each of the connector regions 16*a*, 16*b* with a solderable portion 26 whose uppermost layer is of a solderable material such as copper, and with a weld region or pad 28 whose uppermost surface is stainless steel. FIG. 10 illustrates details of two weld regions 16, showing how the solderable and weldable regions 26, 28 are separately employed in making connections, but soldering-in the component leads 22 and welding the wires 24**.

Soldering and resistance welding are two common techniques used for making electrical connections, which require different characteristics of materials. Good soldering usually requires material of relatively high chemical activity, in order that its surface oxides be rapidly removed by rosin flux to permit the solder to readily adhere thereto. Resistance welding generally requires materials of moderate resistance, so that considerable heat is generated by current passing therethrough. Materials such as copper are easily activated by rosin based solder flux and are therefore readily soldered, but they are not reliably resistance welded due to their high electrical and thermal conductivity. It has been found that good welding can be accomplished by utilizing wire of a material such as nickel or a nickel alloy which has a resistivity about six times that of copper, and by welding it to a material of an even higher resistivity such as stainless steel, which typically has a resistivity of about 40 times that of copper.

Pure copper has a resistivity of 1.67 micro ohm-centimeter, while pure nickel has a resistivity of about 10 micro ohm-centimeter, type 302 stainless steel has a resistivity of about 70 micro ohm-centimeter and type 430 stainless steel has a resistivity of about 55 micro ohm-centimeter. The resistance-weldable material normally should not have a resistance more than an order of magnitude higher than stainless steel (i.e., no more than about 500 micro ohm-centimeters) or else it will not be readily resistance-weldable to common weld wire such as nickel or a nickel alloy. It should be noted that terms such as "moderately high resistance" herein relate to materials normally considered good conductors for carrying information signals in electronic circuits, and their resistance are appreciable only in resistance welding and the like. In the present invention, connector regions are provided which include copper-covered areas that permit soldering, and which merge with uncovered stainless steel that permits welding.

Figure 2:
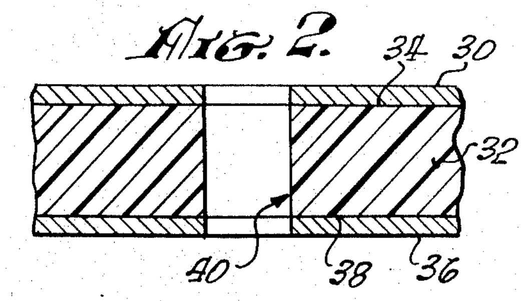
FIG. 2 is a partially sectional view, not to scale, showing a pc board during a first stage of the construction method of the invention, wherein a layer of weldable material such as stainless steel has been applied to an insulative base and the assembly has been drilled.
Figure 3:
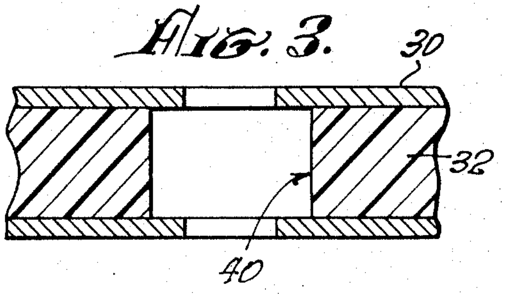
FIG. 3 is a view similar to FIG. 2, but after the holes have been etched back.
Figure 4:
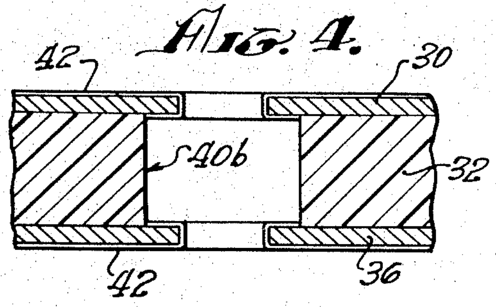
FIG. 4 is a view similar to FIG. 3, but after the stainless steel has been coated with a nickel strike.

FIGS. 1–10 illustrate steps in the construction of a circuit in accordance with the invention. As illustrated in FIG. 2, a layer 30 of a highly weldable material, such as a 400 series stainless steel is applied to an insulative board or base 32 formed by an epoxy-glass laminate. The stainless steel layer 30 is most easily applied by adhering a sheet of stainless steel to a face 34 of the base 32. In a similar manner, another sheet 36 of stainless steel is applied to the lower face 38 of the insulative base. Holes 40 are then drilled through the assembly by chemical drilling or mechanical drilling, the holes being formed in a predetermined pattern which is required in the final circuit board. FIG. 3 illustrates a next step of the process wherein the walls of the holes 30 are etched back in the base 32, which will later help in locking in a plated copper layer. FIG. 4 illustrates the assembly after a next step in which a nickel strike 42 is applied over the stainless steel layers 30, 36 to ready the stainless steel for the following copper plating step. In addition, the walls 40 of the base are sensitized to enable them to be copper plated, as by dipping the assembly in a sensitizing agent such as Metex PTH 9072 manufactured by the Macdermid Company.

Figure 5:
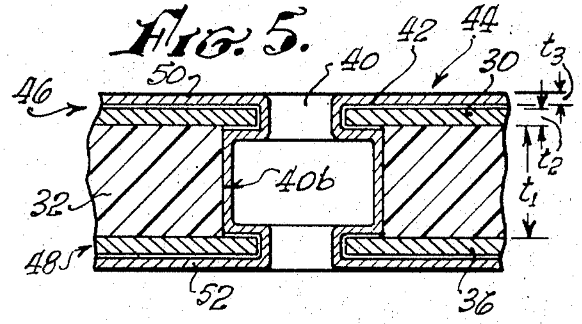
FIG. 5 is a view similar to FIG. 4, but after the apparatus of FIG. 4 has been through-hole panel-plated with a solderable material such as copper.

FIG. 5 illustrates the apparatus after a next step in which the assembly is panel plated to form a layer 44 of copper on substantially all surfaces. The copper covers the surfaces of the stainless steel layers 30, 36 which have a nickel chloride strike thereon, and the sensitized walls 40 of the insulative base 32. In one typical circuit board, the base 32 has a thickness $t_1$ of one-eighth inch, each layer 30, 36 of type 430 stainless steel has a thickness $t_2$ such as 0.005 inch, and the layer 44 of copper has a thickness $t_3$ of 0.002 inch. The nickel strike is a film of a thickness such as 20 microinches, and serves only to condition the surface thereof for copper plating. Films of highly conductive material such as gold may be applied to the stainless steel, without affecting its weldability if they are very thin such as less than 100 microinches.

After the stainless steel and copper layers have been applied, etching can be started to form printed circuit patterns. The patterns are formed in the conductive sandwiches 46, 48 lying on opposite faces of the insulative base, the upper sandwich 46 including the stainless steel layer 30 and the copper layer 50 thereon, and the lower sandwich 48 being formed by the stainless steel layer 36 and the copper layer 52 thereon. In accordance with the present invention, etching of the conductive layers is performed in two stages, the first stage involving etching through the entire thickness of the conductive sandwich 46 and the sandwich 48, and the second process involving etching only through the copper layers 50, 52 but not through the stainless steel layers thereunder.

Figure 6:
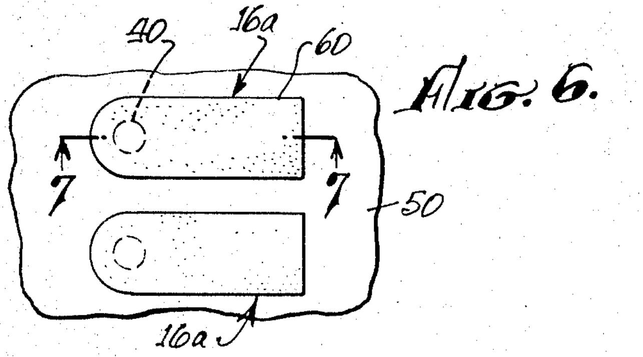
FIG. 6 is a plan view of the apparatus of FIG. 5, showing it after the application of resist in a first pattern thereon.
Figure 7:
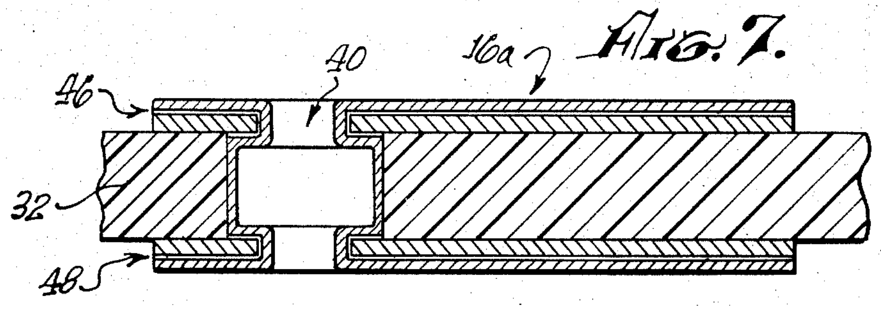
FIG. 7 is a sectional side view taken on the line 7—7 of FIG. 6 after the assembly thereof has been etched with a first etchant that attacks both the copper and stainless steel layers.

The first etching process is accomplished by applying a first resist 60 in a predetermined pattern over both copper layers 50, 52, as illustrated in FIG. 6. In the pc board of the present invention wherein connector pad regions are to be formed, the first resist 60 forms rows of connector pads at **16*a*. The resist 60 is applied so that is also covers the holes 40**. After the resist is applied, an etchant is applied to the entire assembly, including the areas not covered by the resist and the areas covered by the resist. An etchant such as ferric chloride is used which is effective against both copper and stainless steel, so that areas not covered by resist are etched down to the insulative base 32. An etchant down to the insulative base 32. An etchant should be used which produced etching rates of the same order of magnitude in the solderable (copper) and weldable (stainless steel) materials, so that a clean etch is produced through both layers without excessive undercutting of either of them. Ferric chloride attacks both stainless steel and copper at about the same rate, so that it provides a clean etch through the conductive sandwiches. After the first etching process has been completed and the resist 50 has been removed, the printed circuit board has the form illustrated in FIG. 7 wherein the conductive sandwiches 46, 48 are left over only particular regions of the base 32.

The second etching process is begun as illustrated in FIG. 8, by applying a resist 66 in a second pattern on the printed circuit board assembly in regions immediately surrounding the holes 40 and over the holes 40 on both sides of the circuit board. A second etchant such as chromic acid is then applied, which attacks the solderable materials (copper and nickel), but not the weldable material (stainless steel). Suitable etchants may have some etchant effect on the stainless steel, but the etching rate on stainless steel is preferably at least an order of magnitude lower (less than one tenth) than against copper, so that all of the exposed copper can be etched away with a minimum removal of stainless steel. After the assembly has been exposed for a sufficient time to the second etchant, and the second resist 66 then has been removed, the circuit board 10 of FIG. 9 is obtained, which includes connector regions 16 that each comprise a solderable region 26 and a weldable pad region 28. The solderable region 26 is covered by the layers 50, 52 of copper which are part of a continuous layer 44 that extends through the hole 40. The weldable regions 28 are formed by the stainless steel layers 30, 36 in areas thereof which are uncovered by copper or nickel, and which are integral with the region at the bottom of the solderable areas 26. It may be noted that the etching steps can be reversed, as by first applying the second resist pattern 66 illustrated in FIG. 8, etching with the second etchant to remove only copper, and then applying the first resist pattern illustrated in FIG. 6 and etching with the first resist.

The solderability of the copper surfaces can be increased by plating a film of solder on the circuit board assembly prior to applying the first layer of resist. Such a solder film, of a thickness such as 200 microinches, can be easily etched through by the ferric chloride etchant during the first etching step. The solder film must be stripped off the regions where copper is to be removed before the second etching step which utilizes chromic acid. Stripping of the solder film is accomplished after the second resist is applied, by dipping the circuit board assembly in a stripping solution such as Metex solution which is manufactured by the Macdermid Company. An alternative method of solder coating comprises immersing the finished board of FIG. 9 in molten solder and then removing excess solder from the solderable areas by a hydro-squeegee process or a solder leveling process, both of which processes are well known in the art.

The completed printed circuit board assembly is constructed as illustrated in FIG. 10, by first inserting the leads 22 of components 20 into the holes 40 and then wave soldering the lower surface of the assembly to apply solder in a wide area. During wave soldering, quantities of rosin flux and solder 70 such as a tin-lead alloy are applied to the copper, the solder passing, as through a wick, up through the holes 40 so that solder lies over all copper surfaces and in the holes 40 to firmly secure the leads 22 in place. The solder coats regions of the copper around the holes. The solder will not coat the stainless steel weld pad regions 28 because they reject solder. This rejection is largely due to the relatively chemically passive surface condition of the stainless steel even while it is subjected to rosin based solder flux. After the components are soldered in, the wires 24 can be welded to the stainless steel weld pads 28. One weld technique involves the use of opposed electrodes 72, 74 which press against opposite sides of the circuit board, with the wire 24 between one of the electrodes and a weld pad region. The electrodes supply a large current which passes through the wire 24 and the weld pad 28 to weld them together. The welding technique illustrated in FIG. 10 is a through-the-insulation weld which involves the application of sufficient force to the wire 24 to rupture the insulation 74 thereof so that the nickel wire 76 makes direct contact with the electrode 72 and the weld pad 28. After the wire 24 is welded to one weld pad 28, it may be payed out of the electrode 72 and another point on the wire may be welded to another weld pad on the printed circuit board. Thus, both solder and weld connections can be reliably made.

FIG. 11 illustrates a printed circuit board 80 constructed in accordance with another embodiment of the invention, which is similar to the circuit board of FIG. 9 except that underlayers 82, 84 of highly electrically conductive material such as copper is applied beneath the layers 30, 36 of stainless steel or other weldable material. The circuit board is otherwise the same as that described above, and includes layers 50, 52 of copper disposed over certain regions of the stainless steel and extending through holes 40 in the board. The addition of the copper underlayers 82, 84 under the stainless steel permits a lower resistance path through the stainless steel. The stainless steel is generally a sufficiently good conductor for reliable operation of the printed circuit in carrying signals to electronic components, wherein a signal path may be increased by a fraction of an ohm without affecting operation. However, the resistance of the stainless steel is high enough to affect uniformity of welding.

During resistance welding, a high current is passed through the stainless steel, and the amount of heating at the weld changes appreciably with small changes in the resistance of the series current path. If the current passes a considerable distance through only stainless steel, as in FIG. 10, then the amount of heating at the weld will depend upon how close the weld point is to the copper layers, a larger distance resulting in smaller current and perhaps insufficient heating for reliable welding, and a smaller distance resulting in greater current and possible overheating that can damage the insulative base 32. The use of the underlayers 82, 84 of copper which are in facewise electrical contact with the stainless steel (either directly or through thin films of conductive material such as a nickel strike) results in a uniformly low resistance path during welding regardless of how close a welding point is to the copper layers 50, 52 that surround the hole 40. Of course, this is because most of the welding current can flow through the low resistance underlayers. In applications where long narrow conductive strips are to be utilized on the printed circuit board and where stainless steel is to lie at the surface of these conductive strips, as for the strip 18 in FIG. 1, it is possible to utilize an underlayer of copper or other highly conductive material to provide a lower electrical resistance and heat resistance along the strip.

Thus, the invention provides a printed circuit board which permits mass soldering connections as well as weld connections, and which can be produced by mass production techniques that minimize the cost even if the circuit is very complicated. This is accomplished by utilizing highly solderable material such as copper at the solderable locations, and by utilizing a highly weldable material lying under the solderable material and extending beyond it. The material at the weld locations has a resistivity preferably more than 10 times greater than copper any preferably rejects solder. The production of such a board is accomplished by the use of two etching processes, one utilizing an etchant that is effective against both the solderable and weldable materials to form the connector regions, and the other employing an etchant that is effective against only the solderable material to remove it at certain areas of the connector regions to leave weld pads. Greater uniformity of welding can be attained by utilizing an underlayer of highly conductive material under the weldable material.

Although particular embodiments of the invention have been described and illustrated herein, it is recognized that modifications and variations may readily occur to those skilled in the art and consequently it is intended that the claims be interpreted to cover such modifications and equivalents.

What is claimed is:

1. A circuit board comprising:

A plate of electrically insulative material with a plurality of holes extending therethrough;

a first layer of resistance weldable electrically conductive material disposed on said base;

a second layer of solderable electrically conductive material disposed facewise over said first layer and with said layers in electrical contact along their facing surfaces to form a conductive sandwich, said solderable material also extending along the walls of said holes;

said conductive sandwich forming a predetermined pattern on said base which includes solderable connector regions immediately around said holes;

said first layer including regions integral with the solderable connector regions and extending therebeyond and devoid of said second layer to form weldable connector pad regions;

a device with a plurality of electrical leads extending through different ones of said holes;

a quantity of solder in each of said holes which contain said leads, said solder disposed about said leads and adhering to the walls of said hole and to regions of said second layer immediately surrounding said holes; and an electrically conductive wire extending between a plurality of said weldable connector pad regions and welded thereto.

2. The circuit described in claim 1 including:

an underlayer of highly conductive material lying under said first layer and electrically connected facewise thereto, said underlayer constructed of a material having a resistivity less than the resistivity of said first layer.

3. A circuit board comprising:

a base of electrically insulative material;

a first layer of resistance weldable electrically conductive material having a resistivity of more than 10 times the resistivity of copper disposed on said base;

a second layer of solderable electrically conductive material having a resistivity less than one-tenth the resistivity of said weldable material and disposed facewise over said first layer and with said layers in electrical contact;

said first and second layers forming a predetermined pattern on said base which includes solderable connector regions;

said first layer including regions integral with the solderable connector regions and extending therebeyond and devoid of said second layer to form weldable connector pad regions;

an underlayer of highly conductive material lying under said first layer and electrically connected facewise thereto, said underlayer constructed of a material having a resistivity less than one-tenth the resistivity of said first layer and having a thickness great enough so that more current flows through the underlayer than the first layer portions immediately thereover in welding;

first wires soldered to the solderable connector regions; and second wires welded to the weldable connector pad regions.

4. A circuit board comprising:

a plate of electrically insulative material with a plurality of holes therein;

a first layer of resistance weldable electrically conductive material disposed on said base;

a second layer of solderable electrically conductive material disposed facewise over said first layer, at least in a region immediately about some of the holes, and with said layers in electrical contact along their facing surfaces to form a conductive sandwich;

said conductive sandwich forming a predetermined pattern on said base which includes solderable connector regions immediately around at least some of said holes;

said first layer including regions integral with the solderable connector regions and extending therebeyond and devoid of said second layer to form weldable connector pad regions;

a plurality of devices, each having at least one lead, and with the leads extending through different of said holes and held therein by solder disposed about the leads and in the holes and on regions of said second layer immediately surrounding the holes; and an electrically conductive wire extending between a plurality of said weldable connector pad regions and welded thereto.

* * * * *

UNITED STATES PATENT OFFICE
CERTIFICATE OF CORRECTION

Patent No. 3,786,172 Dated January 15, 1974

Inventor(s) Larry R. Conley

It is certified that error appears in the above-identified patent and that said Letters Patent are hereby corrected as shown below:

Column 7, lines 44, and 52, change "base" to --plate--.

Column 8, lines 42,and 50, change "base" to --plate--.

Signed and sealed this 12th day of November 1974.

(SEAL)
Attest:

McCOY M. GIBSON JR.
Attesting Officer

C. MARSHALL DANN
Commissioner of Patents